United States Patent
Kirchgessner et al.

(10) Patent No.: US 7,638,386 B2
(45) Date of Patent: Dec. 29, 2009

(54) INTEGRATED CMOS AND BIPOLAR DEVICES METHOD AND STRUCTURE

(75) Inventors: James A. Kirchgessner, Tempe, AZ (US); Matthew W. Menner, Scottsdale, AZ (US); Jay P. John, Chandler, AZ (US)

(73) Assignee: Freescale Semiconductor, Inc., Austin, TX (US)

(*) Notice: Subject to any disclaimer, the term of this patent is extended or adjusted under 35 U.S.C. 154(b) by 589 days.

(21) Appl. No.: 11/455,025

(22) Filed: Jun. 15, 2006

(65) Prior Publication Data
US 2007/0293004 A1 Dec. 20, 2007

(51) Int. Cl.
*H01L 21/8249* (2006.01)

(52) U.S. Cl. ............... 438/234; 257/E21.696; 257/E27.015

(58) Field of Classification Search .......... 438/234
See application file for complete search history.

(56) References Cited

U.S. PATENT DOCUMENTS

| | | | |
|---|---|---|---|
| 5,296,391 A | 3/1994 | Sato | |
| 5,432,104 A | 7/1995 | Sato | |
| 5,759,883 A | 6/1998 | Kinoshita | |
| 6,482,710 B2 | 11/2002 | Oda | |
| 6,492,238 B1 | 12/2002 | Ahlgren | |
| 6,635,545 B2 | 10/2003 | Bock et al. | |
| 2004/0209418 A1 | 10/2004 | Knoll | |
| 2005/0006724 A1 | 1/2005 | Ehwald | |

*Primary Examiner*—W. David Coleman
*Assistant Examiner*—Sonya D McCall-Shepard
(74) *Attorney, Agent, or Firm*—Ingrassia, Fisher & Lorenz, PC

(57) ABSTRACT

A method is provided for forming bipolar (103) and MOS (105) semiconductor devices in a common substrate (46), comprising, forming a combination comprising an MOS device (105) in a first region (44) of the substrate (46) and a portion (50) of a collector region (82, 64, 62, 50) of the bipolar device (103) in a second portion (42) of the substrate (46), covering the MOS device (105) with differentially etchable dielectric layers (56, 58) and the combination with an etch-stop layer (68), completing formation of the bipolar device (103) without completely removing the etch-stop layer (68) from the MOS device (105), anisotropically etching the differentially etchable layers (56, 58) to form a gate sidewall (56', 58') of the MOS device (105), and applying contact electrodes (98) to the MOS (105) and bipolar (103) devices. One or more dielectric isolation regions (47, 49) are desirably provided as a part of the combination for laterally isolating the MOS (105) and bipolar (103) devices and separating the collector (983, 50) and base (982, 70') contacts of the bipolar device (103).

15 Claims, 7 Drawing Sheets

INTEGRATED CMOS AND BIPOLAR DEVICES METHOD AND STRUCTURE

TECHNICAL FIELD

The present invention generally relates to semiconductor devices, and more particularly relates to semiconductor devices wherein bipolar transistors are integrated with metal-oxide semiconductor (MOS) devices and technology.

BACKGROUND

In the semiconductor arts it is common that manufacturing sequences are particularly tailored to the type of devices being formed. For example, metal-oxide-semiconductor (MOS) devices may be formed using a first process flow and bipolar devices formed using a second, different process flow, each process flow being optimized for the particular type of devices for which it is being used. However, there are some circumstances where it may be desirable in order to optimize overall circuit performance, to have both types of devices available on the same chip, that is, within the same integrated circuit. This can create manufacturing difficulties since the process steps needed to provide optimized MOS devices and the process steps needed to provide optimized bipolar devices can be somewhat incompatible, that is, the steps needed to form one type of device can have deleterious effects on the other devices being formed in or on the same semiconductor substrate. Accordingly, there is a need for improved device structures and methods of fabrication that mitigate and/or overcome such difficulties.

Accordingly, it is desirable to provide an improved manufacturing method and structure wherein bipolar transistors can be advantageously formed in the same substrate with an MOS device manufacturing technology. It is further desirable that the methods, materials and structures employed be compatible with present day manufacturing capabilities and materials and not require substantial modifications of available manufacturing procedures or substantial increase in manufacturing costs. Furthermore, other desirable features and characteristics of the present invention will become apparent from the subsequent detailed description and the appended claims, taken in conjunction with the accompanying drawings and the foregoing technical field and background.

BRIEF DESCRIPTION OF THE DRAWINGS

The present invention will hereinafter be described in conjunction with the following drawing figures, wherein like numerals denote like elements.

DETAILED DESCRIPTION

Figure 1:
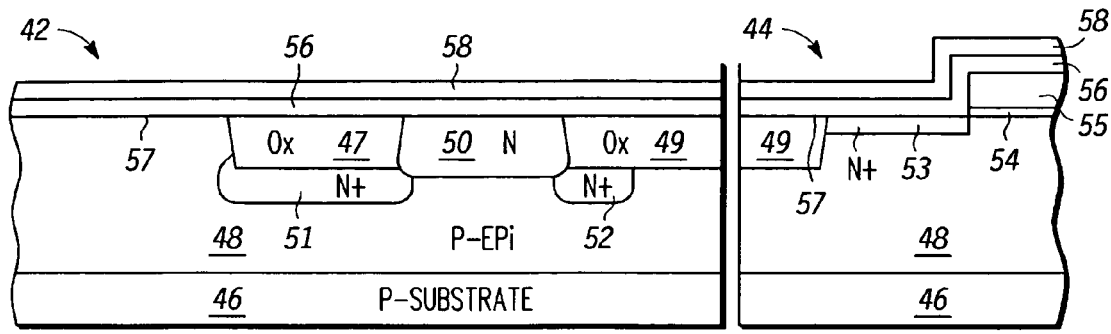
FIGS. 1-21 are simplified schematic partial cross-sectional views of bipolar and MOS device regions in a common substrate at different stages of manufacture according to embodiments of the present invention.

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

For simplicity and clarity of illustration, the drawing figures illustrate the general manner of construction, and descriptions and details of well-known features and techniques may be omitted to avoid unnecessarily obscuring the invention. Additionally, elements in the drawings figures are not necessarily drawn to scale. For example, the dimensions of some of the elements or regions in some of the figures may be exaggerated relative to other elements or regions of the same or other figures to help improve understanding of embodiments of the invention The terms "first," "second," "third," "fourth" and the like in the description and the claims, if any, may be used for distinguishing between similar elements and not necessarily for describing a particular sequential or chronological order. It is to be understood that the terms so used are interchangeable under appropriate circumstances such that the embodiments of the invention described herein are, for example, capable of use in sequences other than those illustrated or otherwise described herein. Furthermore, the terms "comprise," "include," "have" and any variations thereof, are intended to cover non-exclusive inclusions, such that a process, method, article, or apparatus that comprises a list of elements is not necessarily limited to those elements, but may include other elements not expressly listed or inherent to such process, method, article, or apparatus. The terms "left," "right," "in," "out," "front," "back," "up," "down," "top," "bottom," "over," "under," "above," "below" and the like in the description and the claims, if any, are used for describing relative positions and not necessarily for describing permanent positions in space. It is to be understood that the embodiments of the invention described herein may be used, for example, in other orientations than those illustrated or otherwise described herein. The term "coupled," as used herein, is defined as directly or indirectly connected in an electrical or non-electrical manner.

For convenience of explanation and not intended to be limiting, the present invention is described for transistors being formed using silicon semiconductor material, but this is not essential and the principles taught herein apply to a wide variety of semiconductor materials. Non-limiting examples of other suitable semiconductor materials are SiC, AlGaN, diamond, and various other type IV, III-V and II-VI compounds and mixtures thereof and organic semiconductors. Accordingly, while silicon in single crystal, polycrystalline or amorphous form is identified as a suitable and exemplary semiconductor material, and silicon oxide and silicon nitride are identified as suitable and exemplary dielectrics, the present invention is not limited thereto.

FIGS. 1-21 are simplified schematic partial cross-sectional views of bipolar device region 42 and MOS device region 44 at different stages of manufacture 21-41 in common substrate 46 according to an embodiment of the present invention. For convenience of explanation, substrate 46 is identified as a P-type substrate having therein P-Epi layer 48 in which NPN bipolar transistor or device 103 (see FIG. 20) is being formed in bipolar device region 42 and N-channel MOS transistor or device 105 (see FIG. 20) is being formed in MOS device region 44. However this is not intended to be limiting and persons of skill in the art will understand that other substrate materials and/or materials of other conductivity types may also be used, and also that other types of transistors (e.g., PNP, PMOS, CMOS, etc.) may also be formed by applying the principles taught herein. Accordingly, the conductivity types of various materials and regions may be referred to as "first" or "second" conductivity type where it is understood that the words "first" or "second" may refer to either N or P conductivity types, even though for convenience of illustration, one or the other types may be particularly identified in various figures. The process described herein is an optimized MOS process modified so as to permit fabrication of high performance bipolar devices on the same substrate during a single manufacturing sequence, while protecting both the MOS and bipolar devices from potential deleterious effects of such mixed processing steps. The MOS fabrication is illustrated for an NMOS device, but persons of skill in the art will understand that PMOS and other devices may also be formed.

Referring now to FIG. 1 illustrating manufacturing stage 21, wherein certain device regions have already been formed using conventional processing. Dielectric (e.g., oxide) isolation regions 47, 49 have been formed in epi-layer 48 of a first conductivity type by any convenient technique, of which etch and refill is a non-limiting example. Substrate 46 and epi-layer 48 are illustrated as being of P-type conductivity but this is merely by way of example to facilitate understanding and as noted above, a "first" conductivity type may be either N or P and "second" conductivity type generally the opposite. The use of oxide (e.g., $SiO_2$) for isolation regions 47, 49 is preferred but not essential. Isolation region 47 is located so as to separate emitter-base region 107 of bipolar device 103 (see FIG. 20) from collector contact region 109 which will be located between isolation regions 47, 49. Isolation region 49 is intended to provide, for example, lateral isolation between collector contact region 109 and MOS device 105 (see FIG. 20) in MOS region 44. The lateral dimensions of such regions are within the competence of persons of skill in the art depending upon the particular device properties that they seek to obtain. N-doped region 50 located between isolation regions 47, 49 is provided by any conventional doping means. Buried N+ region 51 is desirably provided beneath isolation region 47 and buried N+ region 52 is desirably provided beneath isolation region 49 adjacent N-doped region 50 in bipolar device region 42. Ion implantation is a convenient but not essential means of providing such doped regions. In MOS region 44, N+ source region 53 (and an accompanying drain region, not shown) is conveniently provided in epi-layer 48 adjacent gate insulator (e.g., oxide) region 54 prior to or as part of manufacturing stage 21, but this is not essential. N+ source region 53 (and an accompanying drain region, not shown) may be provided later, as for example, after manufacturing stage 38 of FIG. 18. Either arrangement is useful. For convenience of explanation, it is assumed in the description that follow that source region 53 (and an accompanying drain region, not shown) has been already provided at or as a part of manufacturing stage 21, but this is not intended to be limiting. It is important that gate insulator 54 and gate 55 are provided prior to or as a part of manufacturing stage 21 so that structure 45-1 is obtained. Located above gate insulator region 54 is gate 55 of, for example and not intended to be limiting, doped poly-silicon, but other conductive materials may also be used. For simplicity of illustration the drain region of MOS device 105 has been omitted, but persons of skill in the art will understand that providing a drain region as part of transistor 105 is conventional. At this stage, other than side-wall spacers, contacts to the source, drain and gate, and interconnections thereto, MOS device 105 (see FIG. 20) of MOS region 44 already has its essential elements, e.g., source 53 (and drain), gate insulator 54, gate 55 and lateral isolation region 49. Forming oxide isolation regions 47, 49 and doped regions 50, 51 has not created any significant conflicts with the processing used to form MOS device 105 in region 44. However, before providing the emitter, base and collector regions of bipolar device 103 (see FIG. 20) in bipolar region 42, it is desired to protect MOS region 44 so that it remains unaffected by the bipolar processing. For that reason structure 45-1 comprising substrate 46 with overlying epi layer 48, isolation regions 47, 49 and doped regions 50, 53 extending to surface 57, and gate insulator 54 and gate 55 is covered by: (i) first dielectric layer 56 of, for example and not intended to be limiting, silicon oxide conveniently of about 50 to 500 Angstrom Units thickness with about 150 Angstrom Units thickness being preferred, and (ii) second dielectric layer 58 of, for example and not intended to be limiting, silicon nitride conveniently of about 200 to 2000 Angstrom Units thickness with about 700 Angstrom Units thickness being preferred. This combination of layers protects MOS region 44 so that it is not deleteriously affected by the processing used to provide an optimized bipolar device in bipolar region 42. Portion of layers 56, 58 will ultimately form sidewall spacers 56', 58' for MOS device 105 (see FIG. 20). While silicon oxide and silicon nitride are convenient for forming dielectric layers 56, 58 respectively, they are not essential. What is important is that layers 56, 58 be insulators, thermally stable, and differentially etchable with respect to each other and substrate 46. Resulting structure 45-1 is shown in FIG. 1 at manufacturing stage 21. For convenience of explanation, the words "oxide" and "nitride" are used hereafter in referring to various dielectric layers, such as layers 56, 58 and others introduced later in the process, but this is intended merely to facilitate understanding of the process and as a reminder that such layers are intended to be differentially etchable and not to imply that these layers are limited merely to such materials.

Figure 2:
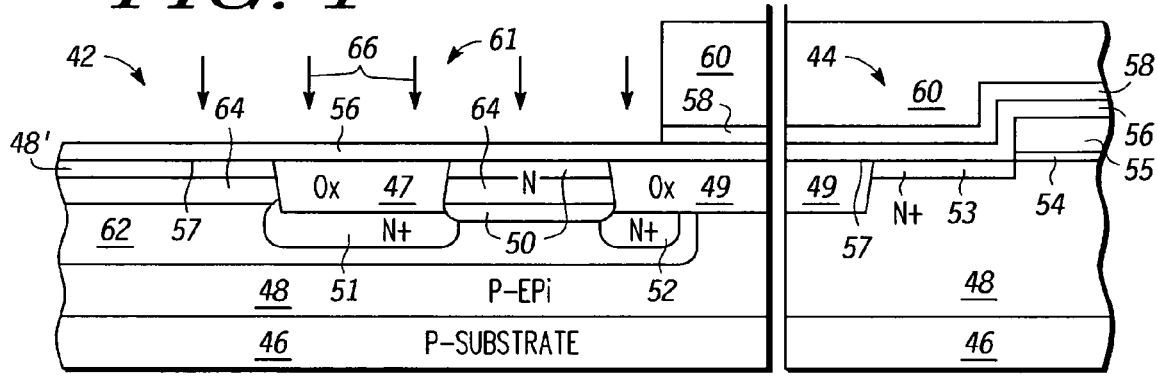
Figure 3:
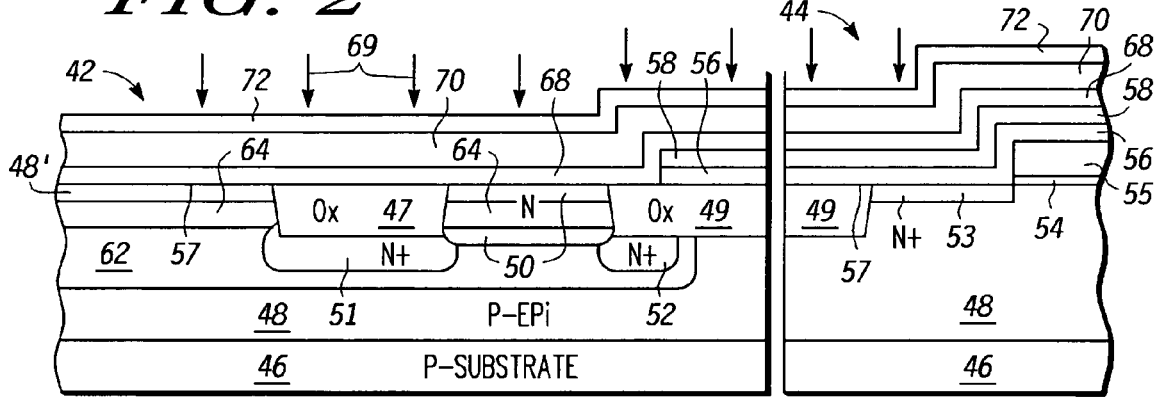

In manufacturing stage 22 of FIG. 2, masking layer 60, of for example photoresist, is added extending over MOS region 44 and a portion of bipolar region 42 above dielectric isolation (e.g., oxide) region 49. The portion of second dielectric (e.g., nitride layer) 58 exposed in opening 61 in mask layer 60 is removed, preferably by reactive ion etching (RIE), but this is not essential and any convenient removal means may be used. Implant 66 is then performed to create, for example, relatively deep phosphorous doped N-type buried collector region 62 extending underneath N-type region 50 and N+ regions 51, 52 in opening 61, and shallower arsenic doped N-type collector enhancement regions 64 extending between dielectric isolation regions 47, 49 and to the left of region 47 under what will become the emitter window. Doses in the range of about 1-10E13 per sq cm are useful with about 6.5E13 per sq cm being preferred. The implant energy is adjusted to provide the desired implant depth relative to isolation regions 47, 49 and surface 57. Persons of skill in the art will understand how to do this depending upon the material thicknesses they are using in their particular structures. Region 48' of the same doping type as epi-region 48 may remain between N-type region 64 and surface 57 to the left of dielectric isolation region 47, but this is not essential. In manufacturing stage 23 of FIG. 3, after implant 66 is complete, mask 60 is removed and the portion of layer 56 exposed in opening 61 is also removed, in either order, using conventional techniques. Blanket dielectric layer 68, of for example but not limited to silicon oxide, is applied over exposed surface 57 and the remaining portion of second dielectric (e.g., nitride) layer 58 of structure 45-2. Layer 68 is provided as to act as an etch stop layer during later processing stages, and is referred to by such name. Layer 68 is then covered by blanket conductor layer 70, of for example, polycrystalline silicon, which is in turn covered by dielectric layer 72, of for example but not limited to silicon oxide. Blanket implant 69, of for example but not limited to boron, is then conveniently provided for the purpose of enhancing P-type doping in conductor layer 70, a portion of which (e.g., portion 70' of FIG. 16) will later form the extrinsic base of bipolar NPN transistor 103 in region 42. As is explained later, extrinsic base implant 69 may also or alternatively be performed in connection with manufacturing stage 35 of FIG. 15. A dose in the range of about 1-20E15 per cm sq is useful with about 10E15 per sq cm being preferred. The implant energy will depend upon the thickness of the various layers chosen by the device designer. Persons of skill in the art will understand how to do this. While implant 69 is shown as a blanket implant this is not essential since, as will be subsequently shown, only relatively small portion 70' (see FIGS. 16-20) of layer 70 toward the left side of region 42 is retained for contacting the base of NPN transistor 103 (see FIG. 20). Structure 45-3 is obtained.

Figure 4:
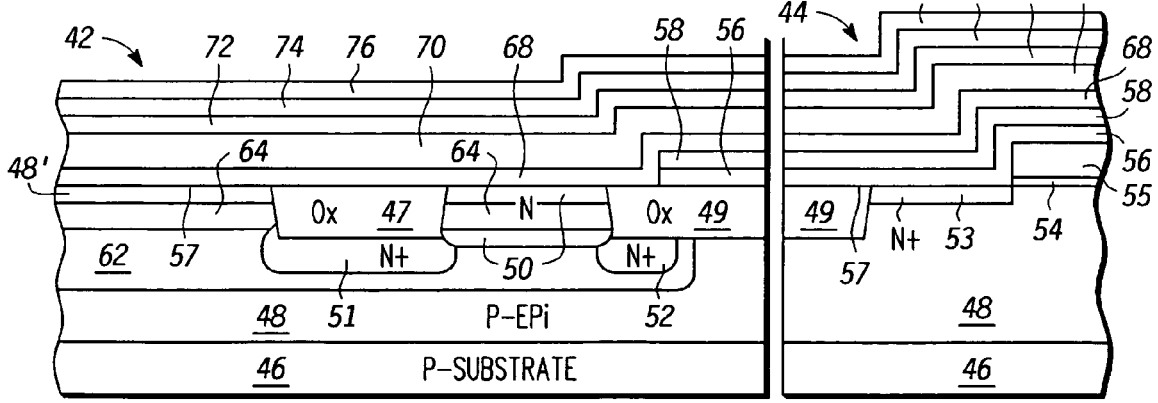
Figure 5:
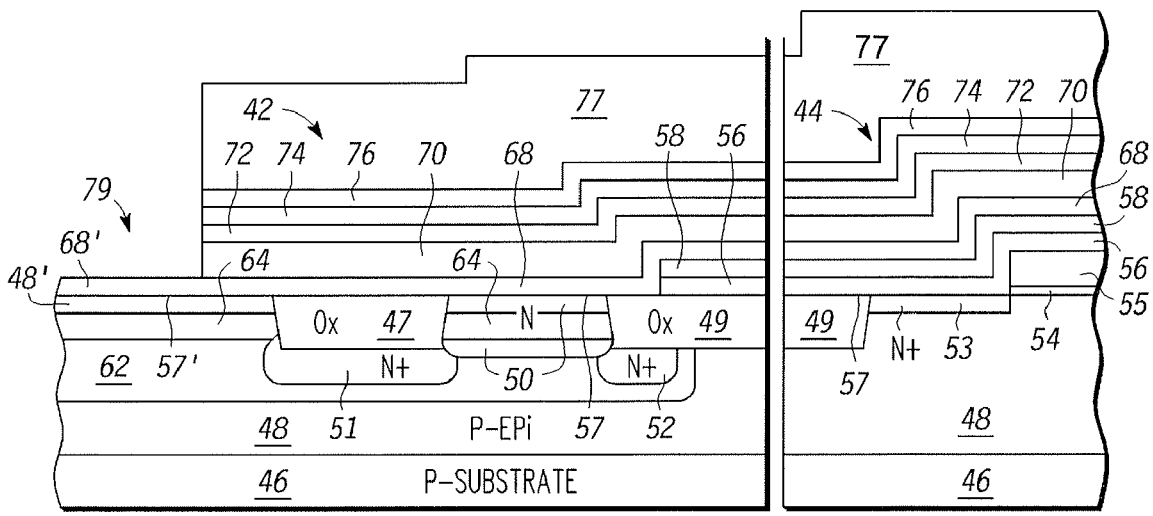
Figure 6:
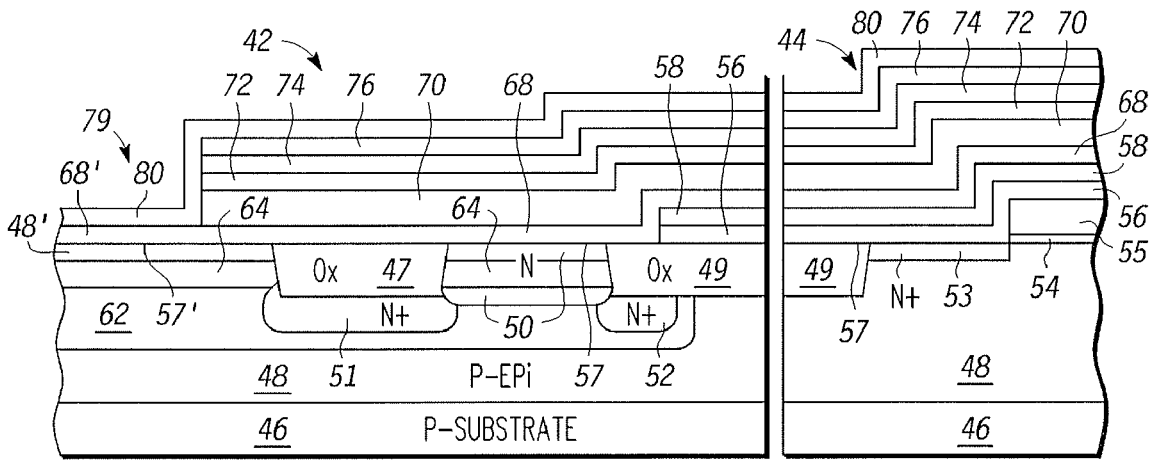
Figure 7:
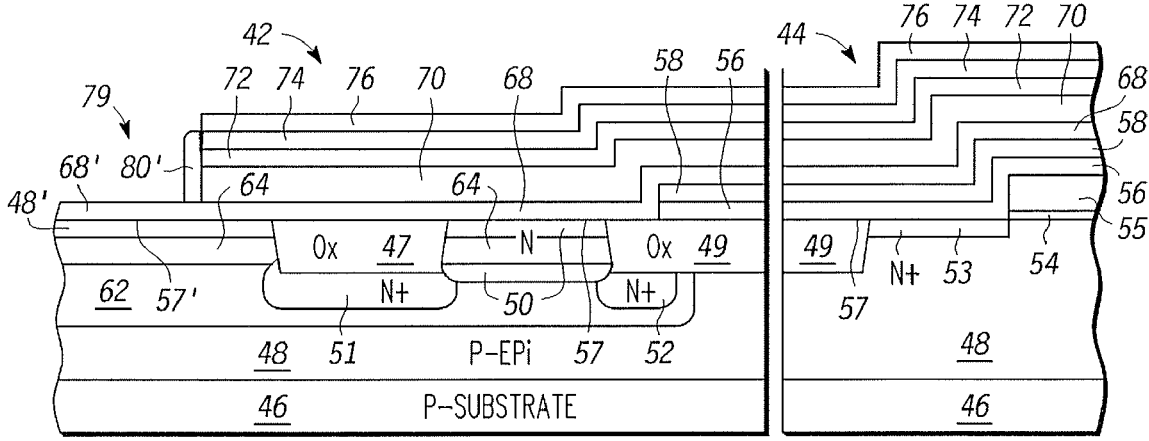

Referring now to manufacturing stage 24 of FIG. 4, blanket dielectric layer 74, of for example but not limited to silicon nitride conveniently of about 200 to 2000 Angstrom Units thickness with about 700 Angstrom Units thickness being preferred, is formed over dielectric (e.g., oxide) layer 72, and blanket dielectric layer 76, of for example but not limited to silicon oxide conveniently of about 100 to 2000 Angstrom Units thickness with about 150 Angstrom Units thickness being preferred, is formed over layer 74. For the same reasons as noted above, the words "nitride" and "oxide" are hereafter applied respectively to layers 74, 76 merely as a convenient labels indicating that they should be differentially etchable, not that they are limited merely to these particular materials. Layer 74 is later connected to side-wall spacer 80' (see FIG. 7) in the emitter-base region to limit selective epitaxial growth (see FIGS. 7-9) while layer 76 provides a convenient etch-stop for formation of side-wall spacer 80'. After deposition of layers 74, 76, structure 45-4 results. In manufacturing stage 25 of FIG. 5, mask 77 is applied having emitter opening 79 above portion 57' of surface 57, to the left of isolation region 47. Mask 77 is used to etch away the portions of layers 70, 72, 74, 76 exposed in opening 79, thereby exposing portion 68' of dielectric layer 68 overlying portion 57' of surface 57, at the left side of bipolar region 42. Reactive ion etching (RIE) is a preferred etching method but other well known etching methods for removing portions of dielectric (e.g., oxide) layer 76, dielectric (e.g., nitride) layer 74, dielectric (e.g., oxide) layer 72 and conductor (e.g., poly) layer 70 may also be used. Structure 45-5 results. Mask 77 is then removed. While photo-resist is convenient for mask 77, other protective organic and inorganic materials well known in the art may also be used, provided that such material can withstand the etching procedures for removing the exposed portions of layers 70, 72, 74 and 76 and then be removed without adversely affecting the remaining layers. As shown in manufacturing stage 26 of FIG. 6, substantially blanket dielectric layer 80, of for example and not intended to be limiting silicon nitride conveniently of about 100 to 1000 Angstrom Units thickness with about 600 Angstrom Units thickness being preferred, is formed over the exposed portion of layer 68 and the remaining portion of layer 76 (and underlying layers) after mask 77 is removed, thereby yielding structure 45-6 shown in FIG. 6. In manufacturing stage 27 of FIG. 7, a differential etching procedure is applied that etches vertically more rapidly than horizontally to selectively remove those portions of dielectric (e.g., nitride) layer 80 that lie substantially parallel to surface 57, thereby leaving behind substantially vertical nitride side-wall spacer 80' in emitter window 79. Such procedures are well known in the art. RIE is a non-limiting example of a suitable technique. Region 68' of oxide layer 68 is exposed to the left of dielectric (e.g., nitride) sidewall spacer 80' and dielectric (e.g., oxide) layer 76 is exposed to the right of side-wall spacer 80'. Resulting structure 45-7 is shown in FIG. 7.

Figure 8:
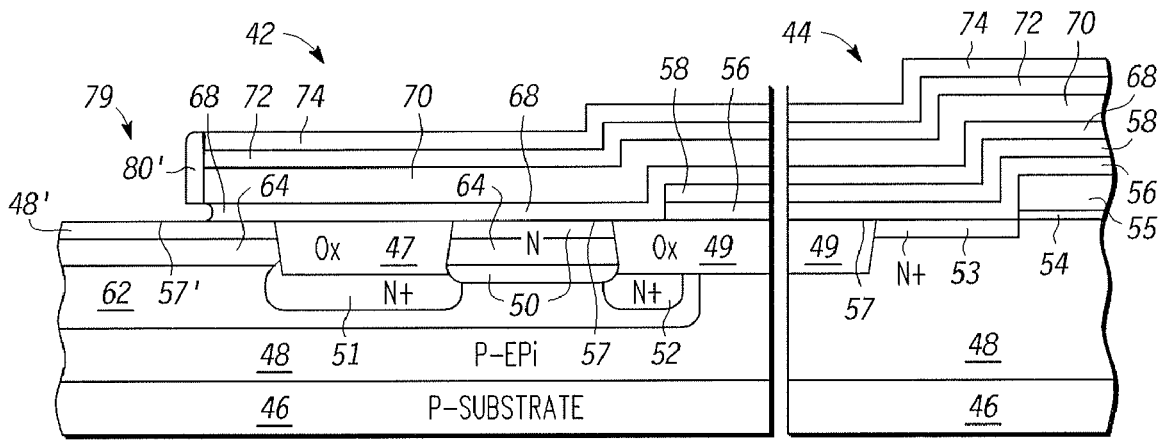
Figure 9:
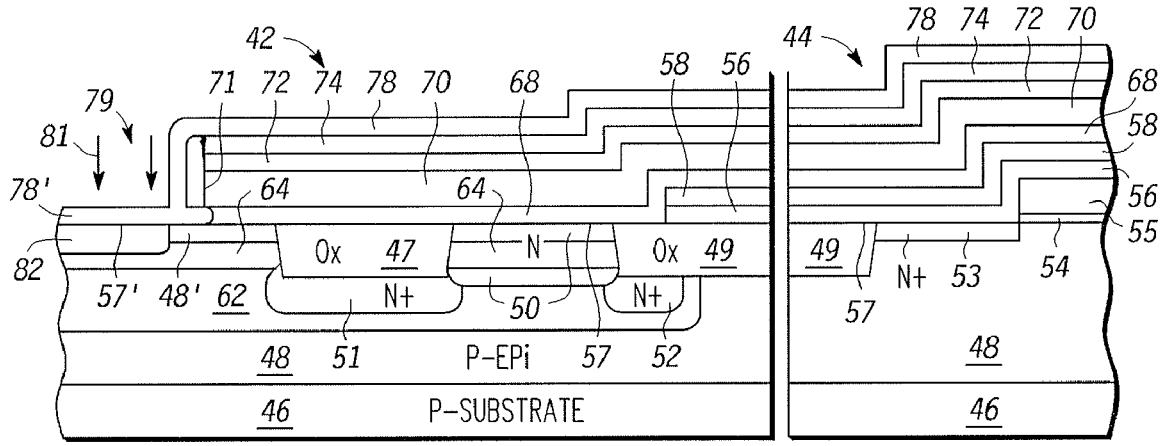
Figure 10:
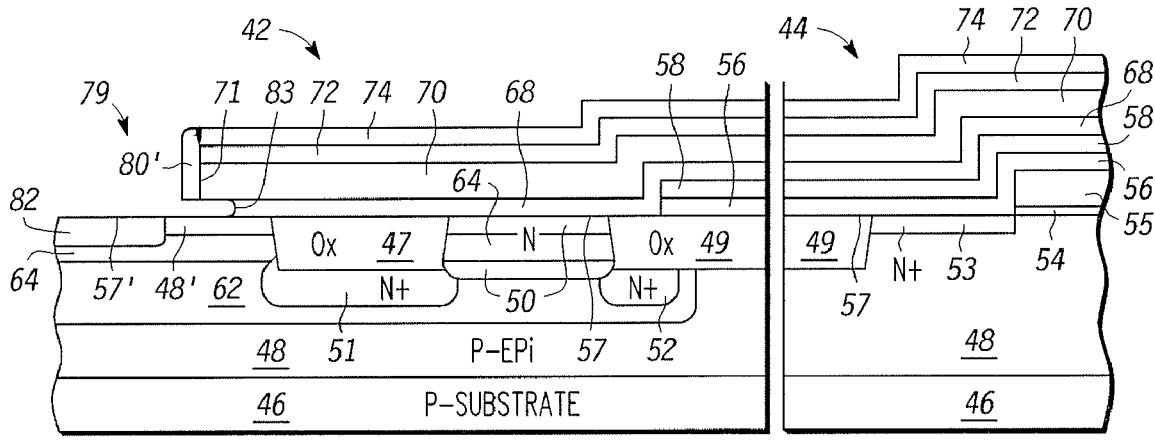
Figure 11:
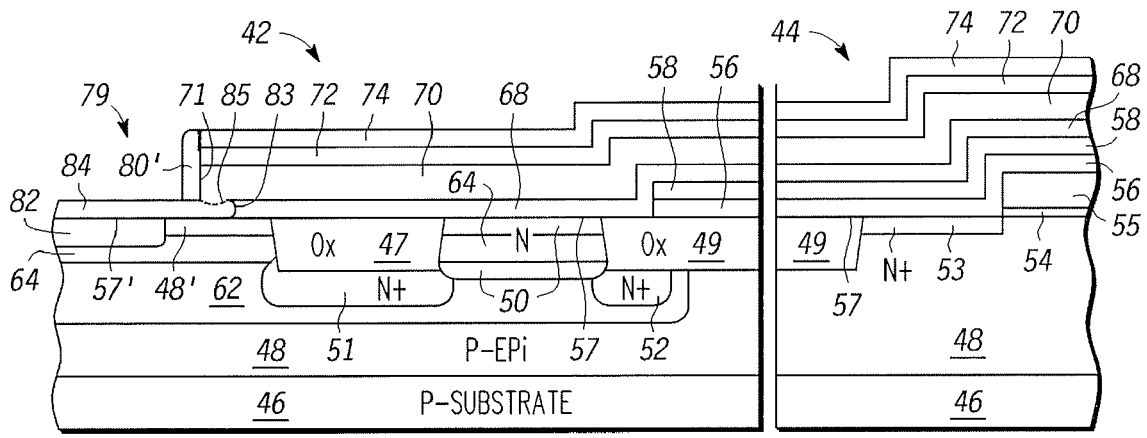

Referring now to manufacturing stage 28 of FIG. 8, region 68' of dielectric (e.g., oxide) layer 68 exposed to the left of dielectric (e.g., nitride) sidewall spacer 80' and dielectric (e.g., oxide) layer 76 exposed to the right of side-wall spacer 80' are removed, by for example a simple wet etch although other etching procedures can also be used. Dielectric (e.g., nitride) side-wall spacer 80' and dielectric (e.g., nitride) layer 74 are exposed along with portion 57' of surface 57 of portion 48' (originally part of P-epi layer 48) that lies between collector enhancement region 64 and surface 57. Dielectric layer 68 is slightly undercut beneath side-wall spacer 80'. Structure 45-8 results. In stage 29 of FIG. 9, blanket dielectric layer 78, of for example silicon oxide conveniently of about 200 to 1000 Angstrom Units thickness with about 750 Angstrom Units thickness being preferred, is then formed over the exposed portions of structure 45-8. This includes portion 78' over exposed portion 57' of silicon surface 57 to the left and underneath nitride side-wall spacer 80'. Layer 78 also covers side-wall spacer 80' and dielectric (e.g., nitride layer) 74. This provides a screen oxide for N-type implant 81, which is provided to enhance the collector doping in region 82 immediately beneath emitter opening 79, extending from surface 57 into buried N-type collector enhancement region 64. Resulting structure 45-9 is shown in FIG. 9. In manufacturing stage 30 of FIG. 10, dielectric (e.g., screen oxide) layer 78 is removed, for example by a wet etch, with sufficient over-etch to clear oxide from underneath side-wall spacer 80' and left edge 71 of conductor (e.g., poly) layer 70 to a distance of about 100 nanometers from left edge 71 of conductor layer 70, as indicated by interface 83. Following this oxide removal etch, portion 57' of surface 57 of single crystal semiconductor substrate epi-region 48' is exposed in emitter widow opening 79. The remainder of structure 45-10 is protected by dielectric (e.g., nitride) side-wall spacer 80' and dielectric (e.g., nitride) layer 74. In manufacturing stage 31 of FIG. 11, structure 45-10 is then exposed to selective epitaxial growth wherein P-type semiconductor (e.g., silicon) forms epitaxially on exposed surface 57' of region 48', including those regions extending under side-wall spacer 80' and into the (e.g., oxide) undercut region up to interface 83, thereby forming P-doped base region 84. Base region 84 will be substantially single crystal under emitter opening 79 and partially polycrystalline where it forms in location 85 in contact with conductor (e.g., poly) layer 70. The thickness of base region 84 can be selected by the device designer depending upon the device characteristics that are desired. Resulting structure 45-11 is shown in FIG. 11. What this accomplishes is to provide the base region of bipolar transistor 103 overlying enhanced collector region 82 and in ohmic contact with conductor (e.g., poly) layer 70 that will eventually form the extrinsic base and base contact region.

Figure 12:
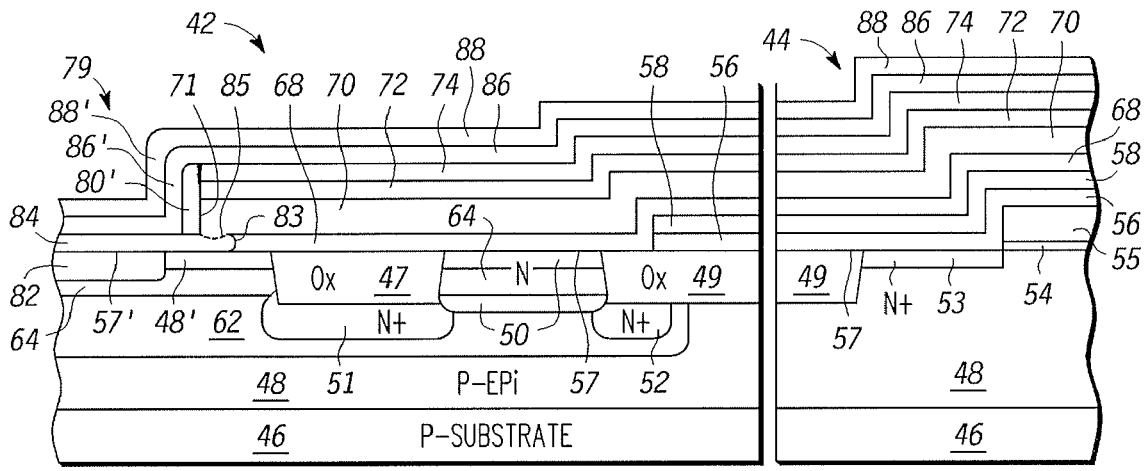
Figure 13:
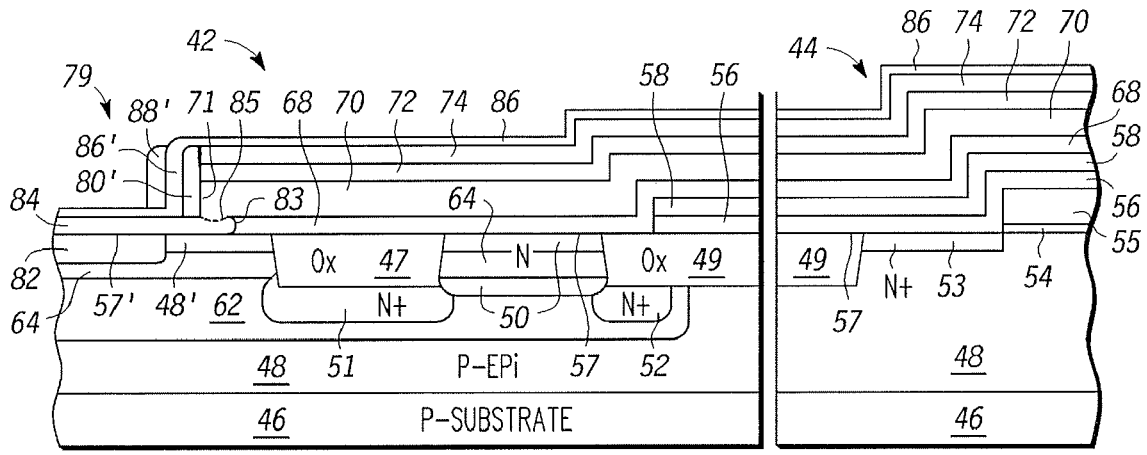
Figure 14:
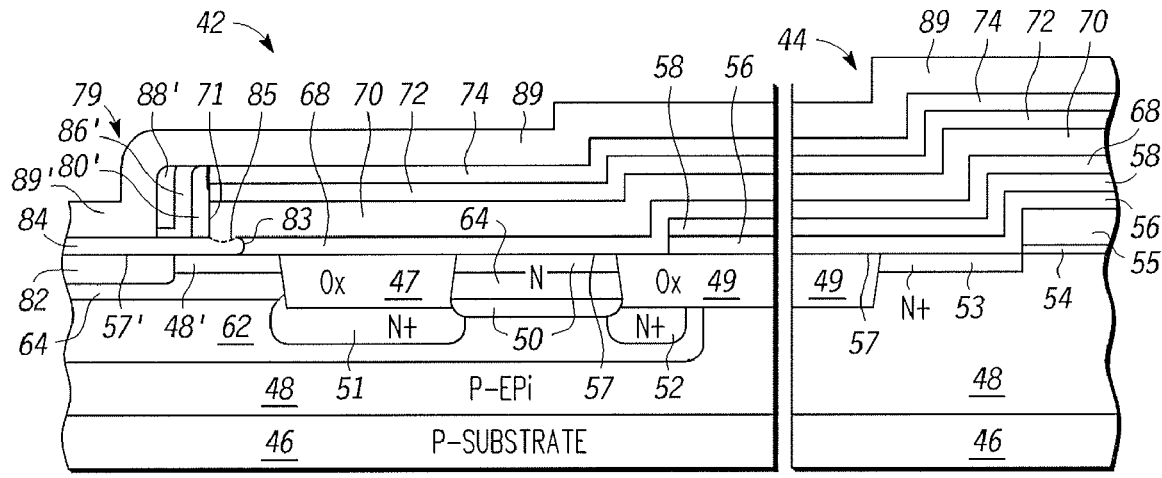

Referring now to manufacturing stage 32 of FIG. 12, structure 45-11 shown in FIG. 11 is covered by dielectric layer 86 (e.g., of silicon oxide) conveniently of about 50 to 500 Angstrom Units thickness with about 300 Angstrom Units thickness being preferred. Dielectric layer 86 is then covered by layer 88, of for example and not intended to be limiting, amorphous semiconductor (e.g., amorphous silicon) conveniently of about 200 to 800 Angstrom Units thickness with about 500 Angstrom Units thickness being preferred. While amorphous silicon is preferred for layer 88, this is not essential since its eventual function is to create a further side-wall spacer in emitter opening 79. Thus, almost any convenient material may be used for layer 88 that is differentially etchable with respect to the material used for layers 74 and 86. Resulting structure 45-12 is shown in FIG. 12. In manufacturing stage 33 of FIG. 13, structure 45-13 of FIG. 13 is anisotropically etched to so that portion 88' of layer 88 is left behind, hereafter referred to as side-wall spacer 88'. RIE is a non-limiting example of a suitable anisotropic technique, but other etch techniques can also be use. Some thinning of underlying dielectric (e.g., oxide) layer 86 can also occur. Resulting structure 45-13 is shown in FIG. 13. In manufacturing stage 34 of FIG. 14, remaining portions of dielectric (e.g., oxide) layer 86 are removed (at least in emitter window 79) thereby generally exposing dielectric (e.g., nitride) layer 74 over the remainder of structure 45-14. N-doped semiconductor layer 89 conveniently of about 500 to 2000 Angstrom Units thickness with about 1500 Angstrom Units thickness being preferred, is then formed over the remaining structure, that is, on base region 84, over side-wall spacers 88', 86' 80' and over exposed portions of dielectric (e.g., nitride) layer 74. Where semiconductor 89 forms on base region 84, it may grow epitaxially. Where it is in contact with side-wall spacers 88', 86', 80' it will generally be poly-crystalline or amorphous. Portion 89' of semiconductor layer 89 provides the emitter of bipolar transistor 103 being formed in bipolar region 42. Resulting structure 45-14 is shown in FIG. 14.

Figure 15:
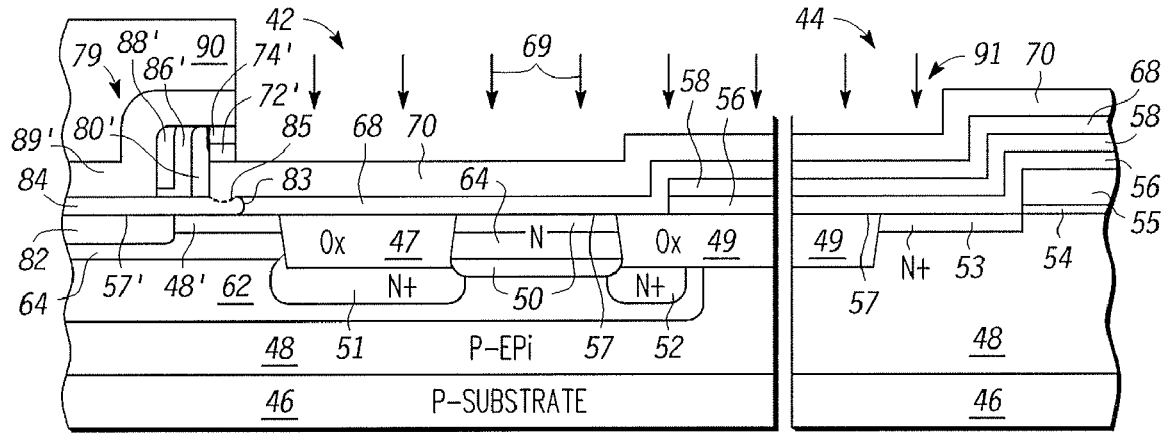
Figure 16:
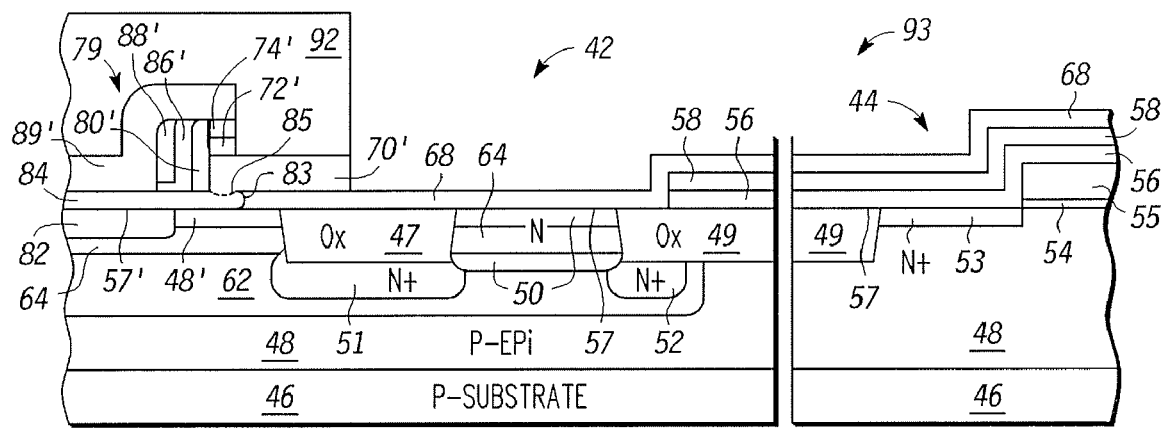
Figure 17:
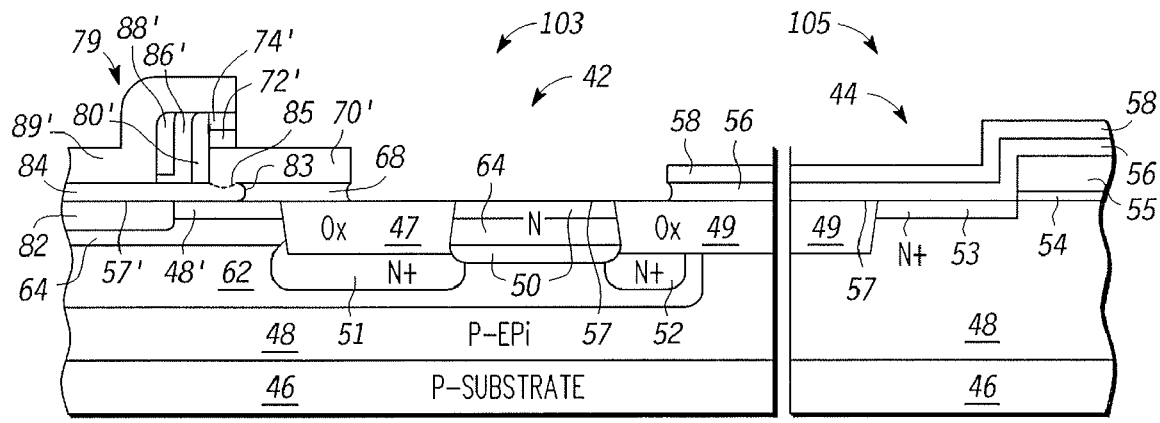

Referring now to manufacturing stage 35 shown in FIG. 15, mask 90, of for example and not intended to be limiting photoresist, is provided over emitter window 79 and side-wall spacers 88', 86', 80' and portions 89', 74', 72' of layers 89, 74, 72 adjacent emitter window 79, so that the remainder of bipolar region 42 and MOS region 44 are exposed in mask opening 91. Those portions of layers 89, 72, 74 exposed in mask opening 91 are removed, by for example and not intended to be limiting RIE. Layer 70 is thereby largely exposed as shown in structure 45-15. Optionally, extrinsic base implant 69 illustrated in manufacturing stage 23 of FIG. 3 may be performed in stage 35 instead of stage 23. Either arrangement (or both) is useful. In manufacturing stage 36 of FIG. 16, mask 90 is removed and mask 92, also conveniently but not essentially of photoresist, is applied. Mask 92 extends over emitter window 79 and extrinsic base portion 70' of semiconductor layer 70. The remainder of structure 45-15 is exposed in mask opening 93 so that the part of semiconductor layer 70 beyond extrinsic base portion 70'may be removed, for example but not essentially by RIE. Structure 45-16 of FIG. 16 results, wherein dielectric (e.g., oxide) layer 68 remains over structure 45-16 to the right of extrinsic base portion 70'. In stage 37 of FIG. 17, dielectric layer 68 not covered by extrinsic base portion 70' is removed by, for example and not intended to be limiting, wet etching. Dielectric (e.g., nitride) layer 58 continues to protect MOS portion 44 with surface dielectric (e.g., oxide) layer 56. Structure 45-17 results. Other than providing electrical contacts to the emitter, base and collector regions of bipolar device 103, fabrication thereof is substantially completed, and the process returns to finishing fabrication of MOS device 105.

Figure 18:
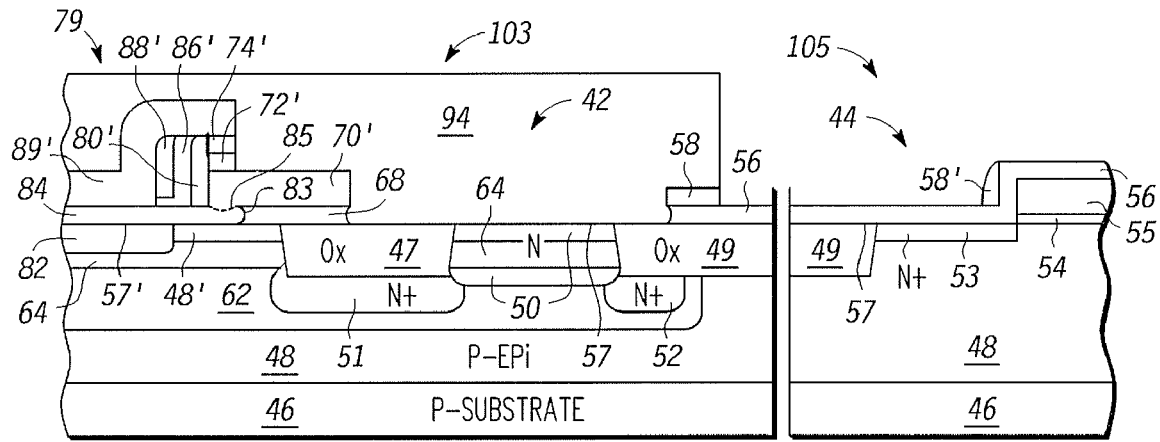
Figure 19:
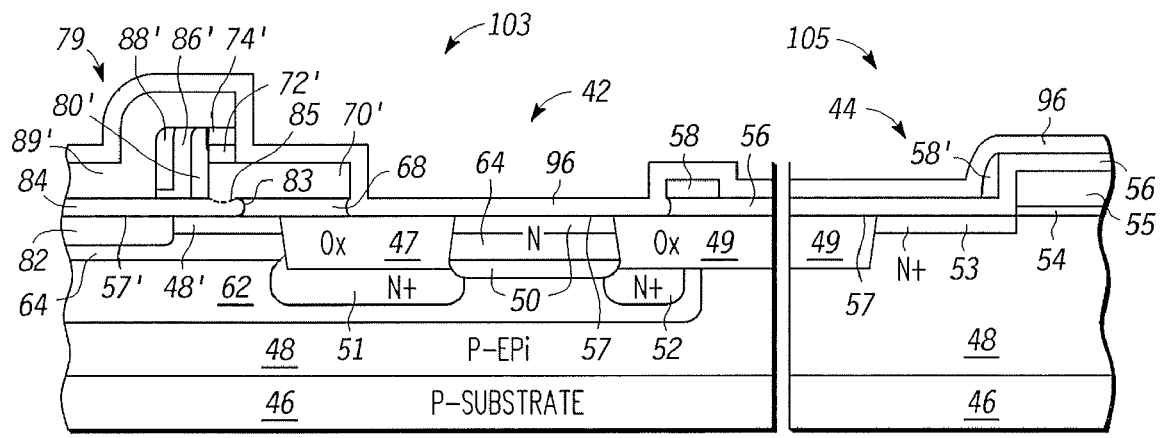

In manufacturing stage 38 of FIG. 18, mask 94 of, for example and not intended to be limiting, photoresist is applied. Mask 94 substantially covers bipolar device region 42 wherein bipolar device 103 has been fabricated, exposing MOS device region 44. An anisotropic etch is performed on second dielectric layer 58, wherein etching in a vertical direction occurs more rapidly than etching in a horizontal direction. RIE is a non-limiting example of a convenient but not essential means for performing such anisotropic etching. Anisotropic etching removes those exposed portions of dielectric layer 58 that lie substantially parallel to surface 57, leaving behind substantially vertical side-wall portion 58' near gate 55. Structure 45-18 results. In manufacturing stage 39 of FIG. 19, mask 94 is removed and the remainder of structure 45-18 is covered by substantially conformal dielectric layer 96 of about 50 to 500 Angstrom Units thickness with about 150 Angstrom Units thickness being preferred. Silicon oxide is a convenient but not essential material for layer 96. Layer 96 is intended to act as an out-diffusion cap to inhibit out-diffusion of dopant from extrinsic base region 70' in bipolar device region 42. Structure 45-19 results. It is desirable but not essential to then perform a brief thermal anneal, as for example but not intended to be limiting, usefully 900 to 1100 degrees Centigrade for 5 to 20 seconds and preferably about 1060 degrees Centigrade for about 5 seconds.

Figure 20:
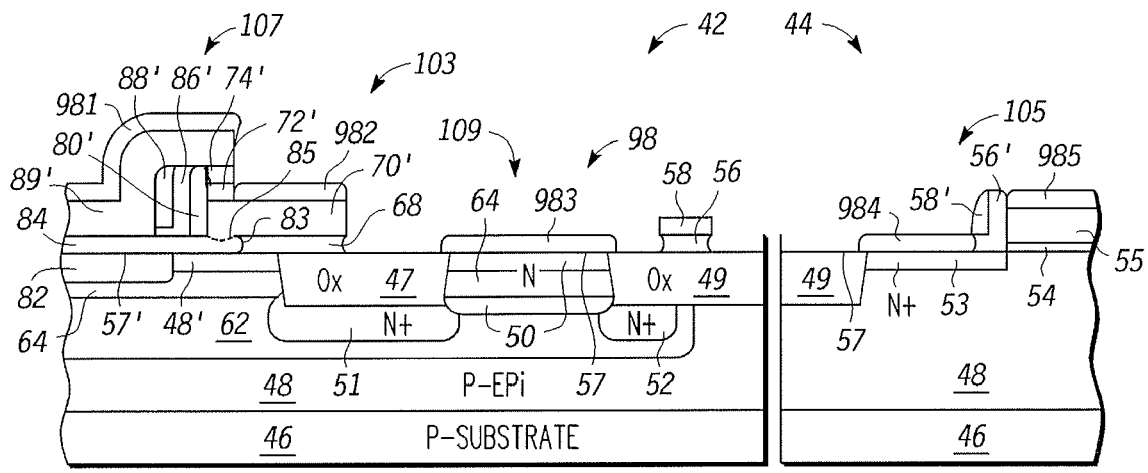
Figure 21:
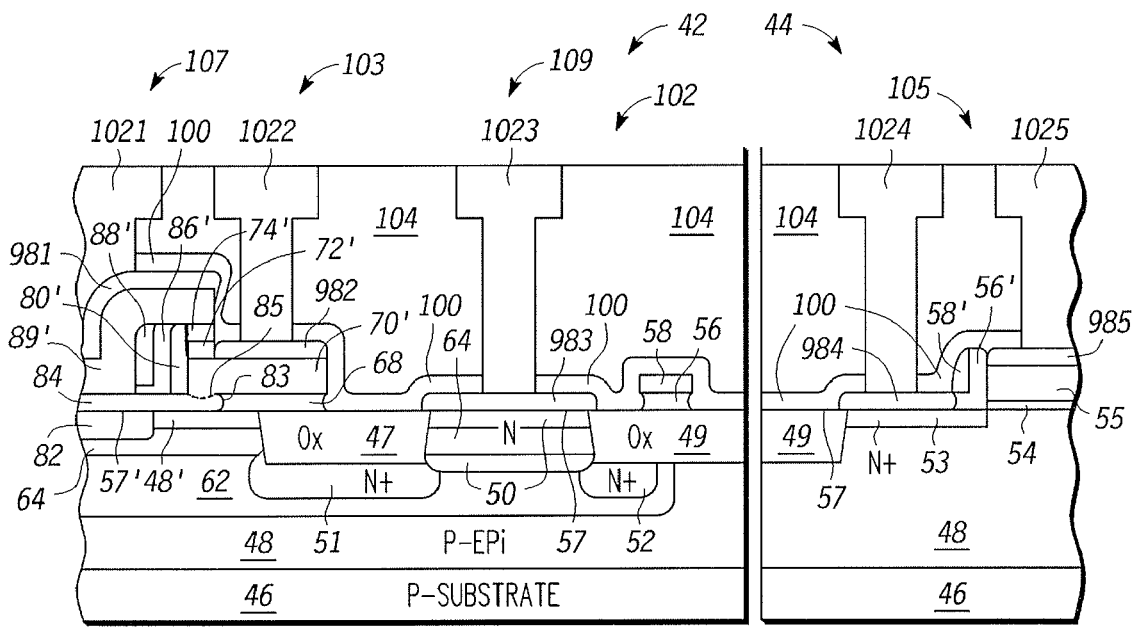

In manufacturing stage 40 of FIG. 20, layer 96 is removed, for example and not intended to be limiting, by wet etching. Conductive electrodes or contacts 98 comprising emitter electrode or contact 981, base electrode or contact 982, collector electrode or contact 983, source electrode or contact 984 and gate electrode or contact 985 are applied in one or more conventional deposition and masking operations. Non-limiting examples of useful materials for such electrodes or contacts are: cobalt silicide, titanium silicide and nickel silicide. Persons of skill in the art will understand that other device regions not shown in FIGS. 1-21 (e.g., drain electrodes or contacts, PNP, PMOS and CMOS devices, etc.,) are also made as needed. Structure 45-20 results. In manufacturing stage 41 of FIG. 21, dielectric layer or layers 104 are provided and interconnections 102 formed extending to device contacts 98, for example, interconnection 1021 to emitter contact 981, interconnection 1022 to base contact 982, interconnection 1023 to collector contact 983, interconnection 1024 to source contact 984, interconnection 1025 to gate contact 985, and so forth. Such electrical interconnections are conventional. Non-limiting examples of suitable materials for interconnections 102 are: tungsten and aluminum. Other well-known conductive materials may also be used.

According to a first exemplary embodiment, there is provided a method for forming bipolar and MOS semiconductor devices in a common substrate, comprising, forming a combination comprising at least a gate insulator and overlying gate of the MOS device in a first region of the substrate and a first portion of a collector of the bipolar device in a second region of the substrate, covering the first region of the substrate with first and second differentially etchable dielectric layers, covering the first and second regions of the substrate with an etch-stop layer, completing formation of the bipolar device without completely removing the etch-stop layer from the MOS device, anisotropically removing a portion of the first and second differentially etchable dielectric layers to form a gate sidewall of the MOS device, and applying electrical contacts to the MOS and bipolar devices. In a further embodiment, forming the combination further comprises, forming one or more dielectric isolation regions adapted to laterally isolate the MOS and bipolar devices. In a still further embodiment, forming the combination further comprises, forming one or more further dielectric isolation regions adapted to laterally separate collector and base contacts of the bipolar device. In a yet further embodiment, the second region of the substrate has a principal surface and the method further comprises, forming a buried collector region underlying the one or more further dielectric isolation regions, communicating with the first portion of the collector region and extending beyond the one or more further dielectric isolation regions into a part of the second region and underlying a portion of the principal surface of the second region. In a still yet further embodiment, the method further comprises, epitaxially forming a base of the bipolar device on the portion of the principal surface of the second region, the base having an exposed surface. In a yet still further embodiment, the method comprises, forming an emitter of the bipolar device on the exposed surface of the base. In an additional embodiment, the method further comprises, forming an extrinsic base contact region insulated from the principal surface of the second region and having a first part overlying a first part of the portion of the principal surface of the second region; and epitaxially forming a base of the bipolar device on the portion of the principal surface of the second region, the base having a first surface portion that is exposed and a second surface portion that extends beneath and makes contact with the first part of the extrinsic base contact region. In a still additional embodiment, the method further comprises, forming an emitter of the bipolar device on the first surface portion of the base.

According to a second exemplary embodiment there is provided a method for forming a semiconductor device, comprising, providing a substrate of a first conductivity type having a principal surface and first and second device formation regions extending to the principal surface and first and second dielectric isolation regions extending to the principal surface, wherein the first dielectric isolation region separates the first and second device formation regions at the principal surface, wherein an electrodeless MOS transistor has been formed at least in part in the first device formation region and comprises at least a gate insulator on the principal surface in proximity a gate located above the gate insulator, and wherein a first doped region of the second conductivity type has been formed in the second device formation region, located between the first and second dielectric isolation regions, covering the electrodeless MOS transistor with first and second differentially etchable dielectric layers, without removing the first and second differentially etchable dielectric layers, forming an electrodeless bipolar transistor in the second device formation region by, providing a second doped region of the second conductivity type in ohmic contact with the first doped region and extending at least beneath the second dielectric isolation regions into a further region of the substrate adjacent the second dielectric isolation region distal from the first dielectric isolation region, forming a third doped region of the second conductivity type extending from the second doped region in the further region to the principal surface, epitaxially forming a base region of the first conductivity type on the third doped region, forming an emitter region of the second conductivity type on the base region, and then removing the first and second differentially etchable dielectric layers from the electrodeless MOS transistor to form a gate sidewall spacer for the MOS transistor, and forming electrodes in contact with at least the gate, the emitter region, the base region and the first doped region. In a further embodiment, the method further comprises as a part of providing a substrate, forming source-drain regions of the MOS Transistor. In a still further embodiment, the method further comprises, prior to forming electrodes, forming source-drain regions of the MOS transistor, and as a part of forming electrodes, forming electrodes on the source-drain regions. In a yet further embodiment, the first and second differentially etchable dielectric layers comprise silicon oxide and silicon nitride, respectively. In a yet still further embodiment, the method further comprises, after covering the electrodeless MOS transistor, forming an etch stop layer over the second differentially etchable dielectric layer, leaving the etch stop layer in place over the MOS transistor until after formation of the emitter region, and then removing a portion of the etch stop layer overlying the first doped region and the MOS transistor.

According to a third exemplary embodiment, there is provided a method for forming an MOS transistor and a bipolar transistor in a common substrate, wherein the substrate has a first conductivity type and a principal surface, the method comprising, in either order, forming on the principal surface in a first portion of the substrate a gate insulator and overlying gate, forming at least two dielectric isolation regions extending to the principal surface, a first dielectric isolation region separating the first portion of the substrate from a second portion of the substrate and a second dielectric isolation region lying in the second portion of the substrate and spaced apart from the first dielectric isolation region, forming a first doped region of a second, opposite conductivity type lying between the first and second dielectric isolation regions, then providing first and second differentially etchable dielectric layers at least over the first portion of the substrate, providing an etch-stop layer over the first and second portions of the substrate, while the etch-stop layer remains in place at least partly over the first portion of the substrate, forming a bipolar transistor having an emitter, base and collector in the second portion of the substrate, removing the etch-stop layer over the first portion of the substrate, thereby exposing the first and second differentially etchable layers thereon, and anisotropically etching the first and second differentially etchable layers over at least part of the first portion of the substrate to form a sidewall spacer adjacent the gate of the MOS transistor. In a further embodiment, the method further comprises, after the anisotropically etching step, providing electrodes in contact at least with the emitter, base, collector and gate. In a still further embodiment, the method further comprises, prior to the step of providing electrodes, forming source-drain regions adjacent the gate of the MOS transistor and providing electrodes in contact with the source-drain regions. In a yet further embodiment, the substrate comprises silicon and the first and second differentially etchable layers comprise silicon oxide and silicon nitride respectively. In a still yet further embodiment, the etch-stop layer comprises silicon oxide. In a yet still further embodiment, the method further comprises, providing a doped region of the second conductivity type underlying the second dielectric isolation region and communicating with the first doped region to bring the first doped region into electrical communication with the collector. In a yet still further embodiment, the method further comprises, during formation of the bipolar transistor a part of the etch-stop layer is left in place on the principal surface of the substrate to insulate an extrinsic base region from the substrate.

While at least one exemplary embodiment has been presented in the foregoing detailed description, it should be appreciated that a vast number of variations exist, especially with respect to choices of semiconductor substrate 46 and epi-region 48, the materials of dielectric layers 56, 58, 68, 72, 74, 78, 96, 100 and semiconductor layers or regions 55, 70, 84, 89, contacts and interconnections 98 and 102 and the particular layout of bipolar region 42 and MOS region 44. Further, while silicon semiconductor of various crystalline forms and doping types, and silicon oxide and silicon nitride dielectrics are illustrated, this is merely by way of example and for convenience of description and not limitation. Accordingly, the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A method for forming bipolar and MOS semiconductor devices in a common substrate, comprising:
    forming a combination comprising a gate insulator and an overlying gate of the MOS device in a first region of the substrate and a first portion of a collector of the bipolar device in a second region of the substrate;
    covering the first region of the substrate with first and second differentially etchable dielectric layers;

covering the first and second regions of the substrate with an etch-stop layer;

completing formation of the bipolar device without completely removing the etch-stop layer from the MOS device;

anisotropically removing a portion of the first and second differentially etchable dielectric layers to form a gate sidewall of the MOS device from remaining portions of the first and second differentially etchable dielectric layers; and applying electrical contacts to the MOS and bipolar devices.

2. The method of claim 1, wherein forming the combination further comprises, forming one or more dielectric isolation regions adapted to laterally isolate the MOS and bipolar devices.

3. The method of claim 1, wherein during formation of the bipolar transistor a part of the etch-stop layer is left in place on the principal surface of the substrate to insulate an extrinsic base region from the substrate.

4. The method of claim 2, wherein forming the combination further comprises, forming one or more further dielectric isolation regions adapted to laterally separate collector and base contacts of the bipolar device.

5. The method of claim 4, wherein the second region of the substrate has a principal surface and the method further comprises, forming a buried collector region underlying the one or more further dielectric isolation regions, and underlying a portion of the principal surface of the second region.

6. The method of claim 5, further comprising, epitaxially forming a base of the bipolar device on the portion of the principal surface of the second region, the base having an exposed surface.

7. The method of claim 5, further comprising:

forming an extrinsic base contact region insulated from the principal surface of the second region and having a first part overlying a first part of the portion of the principal surface of the second region; and epitaxially forming a base of the bipolar device on the portion of the principal surface of the second region, the base having a first surface portion that is exposed and a second surface portion that extends beneath and makes contact with the first part of the extrinsic base contact region.

8. The method of claim 6, further comprising, forming an emitter of the bipolar device on the exposed surface of the base.

9. The method of claim 7, further comprising, forming an emitter of the bipolar device on the first surface portion of the base.

10. A method for forming an MOS transistor and a bipolar transistor in a common substrate, wherein the substrate has a first conductivity type and a principal surface, the method comprising:

forming on the principal surface in a first portion of the substrate a gate insulator and overlying gate;

forming at least two dielectric isolation regions extending to the principal surface, a first dielectric isolation region separating the first portion of the substrate from a second portion of the substrate and a second dielectric isolation region lying in the second portion of the substrate and spaced apart from the first dielectric isolation region;

forming a first doped region of a second, opposite conductivity type lying between the first and second dielectric isolation regions;

providing first and second differentially etchable dielectric layers at least over the first portion of the substrate;

providing an etch-stop layer over the first and second portions of the substrate;

while the etch-stop layer remains in place at least partly over the first portion of the substrate, forming a bipolar transistor having an emitter, base and collector in the second portion of the substrate;

removing the etch-stop layer over the first portion of the substrate, thereby exposing the first and second differentially etchable layers thereon; and anisotropically etching the first and second differentially etchable layers over at least part of the first portion of the substrate to form a sidewall spacer adjacent the gate of the MOS transistor from remaining portions of the first and second differentially etchable layers.

11. The method of claim 10, further comprising, after anisotropically etching, providing electrodes in contact at least with the emitter, base, collector and gate.

12. The method of claim 10, wherein the substrate comprises silicon and the first and second differentially etchable layers comprise silicon oxide and silicon nitride respectively.

13. The method of claim 10, further comprising, providing a doped region of the second conductivity type underlying the second dielectric isolation region to bring the first doped region into electrical communication with the collector.

14. The method of claim 11, further comprising prior to providing electrodes, forming source-drain regions adjacent the gate of the MOS transistor and providing electrodes in contact with the source-drain regions.

15. The method of claim 12, wherein the etch-stop layer comprises silicon oxide.

\* \* \* \* \*

UNITED STATES PATENT AND TRADEMARK OFFICE
CERTIFICATE OF CORRECTION

PATENT NO. : 7,638,386 B2
APPLICATION NO. : 11/455025
DATED : December 29, 2009
INVENTOR(S) : Kirchgessner et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 786 days.

Signed and Sealed this

Ninth Day of November, 2010

David J. Kappos
*Director of the United States Patent and Trademark Office*